March 5, 1957 H. F. A. TE GUDE ET AL 2,784,316

FREQUENCY MODULATION TUNING INDICATORS

Filed Aug. 5, 1952

INVENTOR

Dietrich Hopf

Helmut Franz Alois Te Gude

BY [signature]

AGENT

United States Patent Office 2,784,316
Patented Mar. 5, 1957

2,784,316

FREQUENCY MODULATION TUNING INDICATORS

Helmuth Franz Alois te Gude, Hamburg-Lockstedt, and Dietrich Hopf, Hamburg-Schnelsen, Germany, assignors to Hartford National Bank and Trust Company, as trustee Application August 5, 1952, Serial No. 302,846

Claims priority, application Germany March 8, 1952

2 Claims. (Cl. 250—40)

Figure 1:
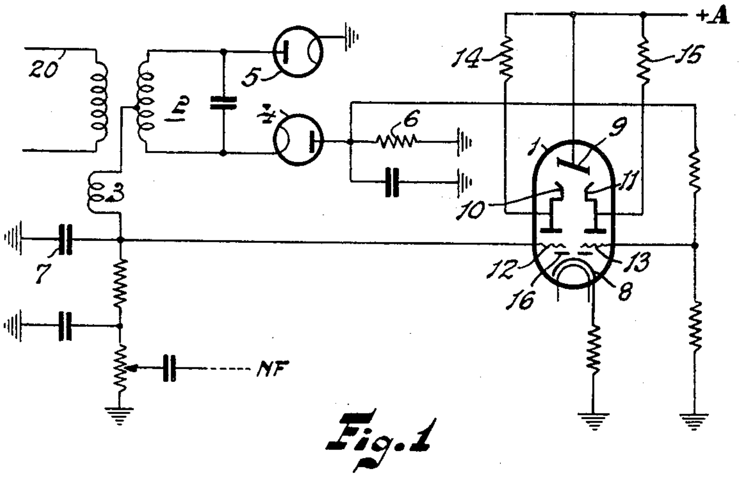

The present invention relates to frequency modulation tuning indicators. More particularly, the invention relates to tuning indication circuits in frequency modulation receivers, the circuit including a cathode-ray tuning indicator tube comprising two mutually independent control members and an asymmetrical ratio detector.

In a known tuning indication circuit in frequency modulation receivers which includes a cathode-ray tuning indicator tube comprising two mutually independent control-members a potential taken from a symmetrical ratio detector is supplied to one of the tuning indicator tube control members. The potential according to the polarity of detuning assumes a positive or a negative value respectively and a zero value when the receiver is suitably tuned. An automatic volume control potential is supplied to the other control member. This provides an indication both concerning the tuning of the right hand side band, the left hand side band or the central frequency and concerning the provision of a sufficiently intense carrier wave.

It has also been suggested to supply high frequency or medium frequency oscillations are produced by the two detectors of a symmetrical ratio detector to a tuning indicator comprising two mutually independent control members, the tuning being the correct one when two luminous sectors on the tuning indicator tube screen are just diametrically opposed, whereas in the case of inaccurate tuning they are at an angle with one another.

The arrangements hitherto known, however, are not adapted for use with asymmetrical ratio detectors, as a control potential is required which approximately should have zero value at correct tuning. However, such a potential is not available in asymmetrical detectors.

The object of the invention is to provide means which in such cases nevertheless enable the use of a tuning indicator tube of the said type. The invention is based on recognition of the fact that in an asymmetrical ratio detector not only the control potential determined by the discriminator characteristic curve of the detector is available, but that in addition a second control potential may be derived therefrom. In accordance with the present invention, the indicator is controlled by a control potential produced by the ratio detector and by a potential having an adequate amplitude obtained from the receiver upon detection of a medium frequency potential so that an indicator control potential is obtained passing through zero at the correct tuning frequency.

It is advantageous to provide at the same time brightness control of the indicator tube by means of the detected medium frequency potential, for example such that the indicator image is brightest in the case of correct tuning. Such a lighting up of the indicator image may on the one hand serve to assist in tuning indication and on the other provides in a simple manner a distinction between correct tuning conditions and the complete lack of a carrier wave.

The invention may be simply put into effect in an arrangement comprising a tuning indicator tube having two amplifying systems arranged in the same envelope and directly coupled with the two control members, the potential taken from the ratio detector being applied to one control grid of one amplifying system, whereas the medium frequency potential detected by means of the ratio detector is applied to the control grid of the other amplifying system.

Figure 2:
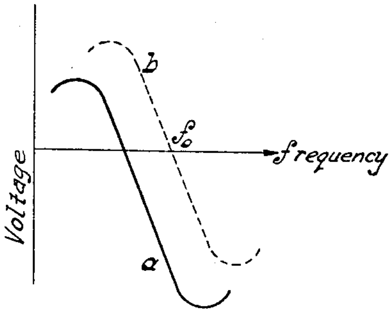
Figure 3:
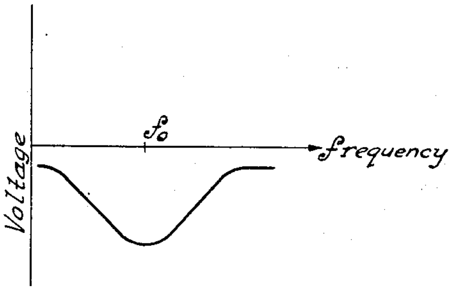
Figure 4:
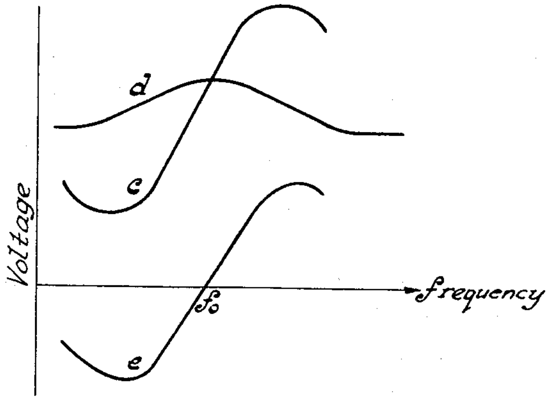

The invention will now be described with reference to the accompanying drawing, in which Figure 1 is a schematic diagram of an embodiment of the tuning indicator system of the invention, comprising an asymmetrical ratio detector and a tuning indicator tube having two triode systems in one envelope;

Figures 2 and 3 are graphical presentations of the two control potentials obtained from the ratio detector; and Figure 4 is a graphical presentation of the potentials set up at the amplifying system anodes and at the indicator tube control members.

Figure 1 shows at the left a ratio detector known per se from which are taken the two potentials required to control a tuning indicator tube 1. The detector comprises a primary circuit 20 coupled on the one hand to a secondary circuit 2 and on the other hand to a coupling winding 3, one end of which is connected to the midpoint of the coil winding of the circuit 2, the other end being connected to ground through a capacitor 7 giving passage to the medium frequency oscillations. The ends of the circuit 2 are connected through detectors 4 and 5 of opposite conductive direction which are connected to ground, one (5) directly and the other (4) through a smoothing filter 6 which is a short-circuit for low frequency oscillations. A detected low frequency potential taken from the terminal NF is thus set up across the capacitor 7. The variation of this potential as a function of the input frequency $f$ is represented in Fig. 2 by the curve $a$. The potential is asymmetrical with respect to earth, i. e. the curve $a$ is not symmetrical about the frequency axis, so that a carrier signal having a frequency corresponding to the midpoint of the detection characteristic produces an output potential of definite magnitude. In contradistinction the potential obtained in a similar manner from a symmetrical ratio detector has zero value when the carrier frequency corresponds to the midpoint of the detector characteristic, as shown by curve $b$ in Fig. 2, the negative and positive maximum values being equal in this case. Obviously a potential variation according to curve $a$ in Fig. 2 lends itself little or not at all to tuning indication in the form hitherto in use, since in correct tuning to the carrier wave frequency $f_0$ the control potential does not assume zero value, but a considerable negative value.

However, available at the anode of the detector 4 in Fig. 1 is also a control potential which is usually used as an automatic volume control potential and the variation of which as a function of the frequency is shown in Fig. 3. According to the invention it is possible by suitable combination of these two potentials obtained from the ratio detector to control a tuning indicator tube comprising two mutually independent control members without the arising of the aforementioned difficulty.

The tuning indicator tube 1 of Fig. 1 comprises a cathode 8, a luminescent screen 9, two control members 10 and 11 and two triode amplifiers 12 and 13, all arranged in the same envelope. The anodes of the amplifiers 12 and 13 are directly connected to the control members 10 and 11 and through suitable resistors 14 and 15 to the positive terminal of the source of supply potential; said supply source being connected to the screen 9. The control grid of one triode 12 has applied to it the potential across the capacitor 7 which varies according to curve $a$ of Fig. 2, while the control grid of the triode amplifier 13 has applied to it the entire potential across the smoothing filter 6 or a suitable part thereof, which varies as shown in Fig. 3. Thus at the control member 10 a potential according to curve *c* of Fig. 4 is set up and at the control member 11 a potential according to curve *d* of said figure is set up, the difference between these two potentials, as shown by curve *e* of Fig. 4, acting as a deflecting potential of the cathode ray. If the voltage at the deflecting electrodes 10 and 11 are equal, that means that the control voltage of the indicator tube 1, which is the difference between both deflecting voltages, is zero, the electron beam in tube 1 is the least deflected, but as soon as the deflection voltages differ and consequently the control voltage is different from zero, the deflection becomes larger. This deflecting potential has a variation similar to curve *b* of Fig. 2 and thus permits favorable tuning similar to that in the usually symmetrical ratio detectors.

Applying the potential at the anode of the amplifier 13 corresponding with curve *d* of Fig. 4 also to an intensity control member 16 of the indicator tube 1 ensures at the same time intense lighting up of the screen image in the case of correct tuning. This lighting up is useful to show whether or not a carrier wave of sufficiently high amplitude is available. However the intensity control member 16 is not necessarily provided for this purpose, as the deflecting member 11 already has more or less a similar function.

It is to be understood that the invention is not limited to the details disclosed but includes all such variations and modifications as fall within the spirit of the invention and the scope of the appended claims.

What we claim is:

1. A tuning indicator system for a frequency modulation receiver, comprising a cathode-ray indicator tube producing a cathode-ray beam and having two deflecting members, a ratio detector having an output voltage characterstic asymmetric about the central frequency thereof thereby producing an output voltage of given value and polarity when a frequency modulated wave having a nominal frequency equal to said central frequency is applied to said detector, said output voltage comprising a first component of magnitude and polarity varying in accordance with the departure of the nominal frequency of said frequency modulated wave from said central frequency and a second component of predetermined polarity and of magnitude varying in accordance with the magnitude of said frequency modulated wave, said second component comprising a rectified voltage, means for applying said output voltage to one of said deflecting members, means for producing a second voltage having a magnitude substantially equal to that of said second component, and means for applying said second voltage to the other of said deflecting members whereby the difference between said output voltage and said second voltage is equal to zero when the said nominal frequency of said wave is equal to the said central frequency of said detector characteristic.

2. A tuning indicator system for a frequency modulation receiver, comprising a cathode-ray indicator tube producing a cathode-ray beam and having two deflecting members and means for controlling the intensity of said beam, a ratio detector having an output voltage characteristic asymmetric about the central frequency thereof thereby producing an output voltage of given value and polarity when a frequency modulated wave having a nominal frequency equal to said central frequency is applied to said detector, said output voltage comprising a first component of magnitude and polarity varying in accordance with the departure of the nominal frequency of said frequency modulated wave from said central frequency and a second component of predetermined polarity and of magnitude varying in accordance with the magnitude of said frequency modulated wave, said second component comprising a rectified voltage, means for applying said output voltage to one of said deflecting members, means for producing a second voltage having a magnitude substantially equal to that of said second component, means for applying said second voltage to the other of said deflecting members whereby the difference between said output voltage and said second voltage is equal to zero when the said nominal frequency of said wave is equal to the said central frequency of said detector characteristic, and means for applying said second voltage to said intensity controlling means.

References Cited in the file of this patent

UNITED STATES PATENTS

| | | |
|---|---|---|
| 2,194,516 | Anderson | Mar. 26, 1940 |
| 2,395,725 | Crosby | Feb. 26, 1946 |
| 2,502,293 | Vilkomerson | Mar. 28, 1950 |
| 2,514,327 | Grant | July 4, 1950 |